US006816381B2

(12) United States Patent
Takeuchi

(10) Patent No.: US 6,816,381 B2
(45) Date of Patent: Nov. 9, 2004

(54) ELECTRONIC CIRCUIT BOARD CASE

(75) Inventor: Kyohei Takeuchi, Takanezawa-machi (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 09/794,398

(22) Filed: Feb. 28, 2001

(65) Prior Publication Data

US 2001/0028555 A1 Oct. 11, 2001

(30) Foreign Application Priority Data

Mar. 1, 2000 (JP) ..................................... 2000-055435

(51) Int. Cl.$^7$ ................................................ H05K 5/02
(52) U.S. Cl. ..................... 361/752; 174/50; 174/52.1
(58) Field of Search ............................. 361/752, 736, 361/730, 796; 174/50, 50.5, 52.1

(56) References Cited

U.S. PATENT DOCUMENTS

| | | | | |
|---|---|---|---|---|
| 5,285,353 A | * | 2/1994 | Buck et al. | 361/732 |
| 5,386,337 A | * | 1/1995 | Schoettl | 361/622 |
| 5,473,509 A | * | 12/1995 | Schoettl et al. | 361/715 |
| 5,532,431 A | * | 7/1996 | Saka et al. | 174/52.3 |
| 5,671,122 A | * | 9/1997 | Schoettl et al. | 361/715 |
| 5,763,754 A | * | 6/1998 | Buendgen | 800/320.1 |
| 5,764,487 A | * | 6/1998 | Natsume | 361/775 |
| 6,084,776 A | * | 7/2000 | Cuntz et al. | 361/707 |
| 6,128,195 A | * | 10/2000 | Weber et al. | 361/737 |
| 6,233,153 B1 | * | 5/2001 | Baur et al. | 361/752 |
| 6,242,690 B1 | * | 6/2001 | Glover | 174/35 GC |
| 6,297,448 B1 | * | 10/2001 | Hara | 174/52.3 |
| 6,356,458 B1 | * | 3/2002 | Andreassen | 361/807 |
| 6,407,925 B1 | * | 6/2002 | Kobayashi et al. | 361/752 |
| 6,552,911 B1 | * | 4/2003 | Haupt et al. | 361/752 |

FOREIGN PATENT DOCUMENTS

| | | |
|---|---|---|
| JP | 10-224057 | 8/1998 |
| JP | 2586966 | 10/1998 |
| JP | 11-261254 | 9/1999 |

* cited by examiner

Primary Examiner—David Martin
Assistant Examiner—Dameon E. Levi
(74) Attorney, Agent, or Firm—Armstrong, Kratz, Quintos, Hanson & Brooks, LLP

(57) ABSTRACT

An electronic circuit board case having an upper case member having a peripheral edge portion defining an opening, a lower case member having a peripheral edge portion defining an opening, the peripheral edge portions of the upper and lower case members being of complementary shape, fastening means for fastening the upper case member and the lower case member together with an edge portion of the electronic circuit board between the peripheral edge portions, and protrusions provided on inner side walls of the upper case member and lower case member, the protrusions being located to face one another in such a manner that they clamp a local edge region of the electronic circuit board clamped therebetween. With this, the electronic circuit board can be firmly and reliably fastened to the case without reducing the mounting area of the circuit board or increasing the number of fabrication steps, and warping of the electronic circuit board can be prevented so as to preclude occurrence of cracking. In addition, the strength of the case is increased.

3 Claims, 8 Drawing Sheets

AT 100°C

AT −40°C

AT 100°C

AT −40°C

ELECTRONIC CIRCUIT BOARD CASE

BACKGROUND OF THE INVENTION

1. Field of the Invention

This invention relates to an electronic circuit board case, particularly to a case for an electronic circuit board that accommodates the electronic circuit board in an internal space defined by upper and lower case members and prevents cracking of soldered portions between the electronic circuit board and electronic components owing to thermal stress and/or vibration.

2. Description of the Related Art

An electronic circuit board housed in a case and mounted on a vehicle or the like is apt to experience cracking of soldered portions between the circuit board and electronic components mounted thereon, particularly between the circuit board and surface-mounted components without leads (leadless components), owing to vibration from outside and thermal stress caused by temperature change, more specifically warping of the circuit board caused by difference in coefficient of thermal expansion between the case and the circuit board. The circuit board is therefore fixed at multiple points by an upper case member or upper and lower case members so as to prevent circuit board warping.

FIG. 8 is a schematic view of an electronic circuit board case according to the prior art.

The case includes an upper case member 10 and a lower case member 12, both fabricated by press-forming thin metal sheet. An electronic circuit board 14 mounted with electronic components (not shown) is accommodated in the internal space defined by the upper and lower case members 10 and 12. More specifically, the lower case member 12 is fit into a lower open end of the upper case member 10 while accommodating the electronic circuit board 14.

The lower case member 12 is formed with a number of pedestals 16 and, at its edge portions, locally with lugs 18. The upper case member 10 is formed with screw holes 20 that align with the lugs 18.

After the electronic circuit board 14 has been placed on and fastened to the pedestals 16 by screws (not shown), the upper case member 10 is set in place from above, and the upper case member 10 and lower case member 12 are united by passing screws 24 through the screw holes 20 of the upper case member 10 and screwing them into lug screw holes 22 formed in the lugs 18.

As taught by Japanese Utility Model Registration No. 2586966, moreover, there is also known a technique of fastening the circuit board and upper and lower case members together with the edge portion of the circuit board clamped between the edge portions defining openings of the upper and lower case members.

Further, as taught by Japanese Patent Laid-Open Applications Hei 10(1998)-224057 ('057) and Hei 11(1999)-261254 ('254), for example, it is also known to fasten the circuit board to the case without screwing the circuit board and case together. Specifically, according to the technique taught by '057, a number of projections are formed on the ceiling of the upper case member and on the floor of the lower case member, and the circuit board is immobilized or retained by clamping its surfaces between the two sets of projections. On the other hand, '254 teaches a technique of fixing a circuit board by clamping its edge portion together with a cushioning material of rubber or the like between the edge portions defining openings of the upper and lower case members.

When the surface of a circuit board is retained at multiple points by use of screws, the circuit board can be firmly fastened to prevent warping and the occurrence of warping-induced cracking, but the mounting area of the circuit board is reduced and the fabrication steps required are increased in number and/or complexity. When a circuit board is fastened by clamping the entire length of its edge portion, thermal stress produced by warping and vibration cannot be absorbed and, depending on the use environment, stress produced by temperature change and/or vibration may be aggravated.

While the technique involving use of a cushioning material reduces vibration-induced stress, it does not overcome the problem of circuit board warping caused by temperature change. It is also disadvantageous in terms of number of fabrication steps and cost.

Further, as illustrated in FIG. 9, the action of thermal stress is relatively large around the circuit board fastening points (screw fastening regions), so that these regions are likely to experience heavy warping and, as a result, cracking. In the situation of an acceleration sensor (accelerometer) or other such device whose detection accuracy must be optimized, however, it is preferable to join the circuit board and the case solidly together so that vibration and shock are transmitted without damping and to install the device in the vicinity of a fastening point, such as at the edge portion of the circuit board. It is therefore preferable to join the circuit board and case firmly and to prevent cracking by ensuring that the circuit board does not warp in the vicinity of the fastening points. In the situation of mounting an acceleration sensor or the like, moreover, use of a cushioning material like rubber, which degrades detection accuracy, should best be avoided.

Further, in order to protect the case itself and the electronic circuit board housed therein from vibration and impacts received from the outside, the strength of the case should be increased to the greatest extent possible without increasing the weight of the case.

SUMMARY OF THE INVENTION

An object of the present invention is therefore to provide an electronic circuit board case that, without reducing the mounting area of the circuit board or increasing the number of fabrication steps, prevents warping of the electronic circuit board owing to thermal stress and/or vibration and thus prevents cracking of soldered portions, enables firm and reliable immobilization of the electronic circuit board, and achieves increased case strength.

For realizing this object, a first aspect of this invention provides a case for an electronic circuit board comprising an upper case member having a peripheral edge portion defining an opening, a lower case member having a peripheral edge portion defining an opening, the peripheral edge portions of the upper and lower case members being of complementary shape, fastening means for fastening the upper case member and the lower case member together with an edge portion of the electronic circuit board between the peripheral edge portions, and protrusions provided on inner side walls of the upper case member and lower case member, the protrusions being located to face one another in such a manner that they clamp a local edge region of the electronic circuit board clamped therebetween.

Since an edge portion of the electronic circuit board is clamped between peripheral edge portions of the upper and lower case members and a local edge region of the electronic circuit board is further clamped between the protrusions formed at opposing locations on the inner side walls of the upper and lower case members, the electronic circuit board can be firmly and reliably fastened to the case without reducing the mounting area of the circuit board or increasing the number of fabrication steps, and warping of the electronic circuit board can be prevented so as to preclude occurrence of cracking. In addition, the strength of the case is increased.

In a second aspect, the invention provides an electronic circuit board case, wherein flange portions are formed at corners of the peripheral edge portion of the upper case member, flange portions are formed at corners of the peripheral edge portion of the lower case member at locations opposite the flange portions of the upper case member, the fastening means clamps the electronic circuit board between the flange portions, and the protrusions formed at opposing locations on the inner side walls of the upper and lower case members clamp a local edge region of the electronic circuit board.

Since flange portions are formed to oppose one another at corners of the peripheral edge portions of the upper and lower case members, the fastening means clamps the electronic circuit board between the flange portions, and the protrusions formed at opposing locations on the inner side walls of the upper and lower case members clamp a local edge region of the electronic circuit board, the electronic circuit board can be still more firmly and reliably fastened to the case and the strength of the case can be further increased.

In a third aspect, the invention provides a case for an electronic circuit board, wherein the protrusions are formed integrally with flange portions as continuations thereof.

Since the protrusions are formed integrally with flange portions as continuations thereof, warping of the electronic circuit board in the vicinity of the fastening points between the electronic circuit board and case members, i.e., in the vicinity of screw fastening regions, can be effectively prevented. As a result, cracking in the vicinity of the screw fastening regions can also be effectively prevented.

DETAILED DESCRIPTION OF THE PREFERRED EMBODIMENT

An electronic circuit board case according to an embodiment of the present invention will now be explained. Constituents similar to those of the prior art are assigned like reference symbols and will not be explained again.

Figure 1:
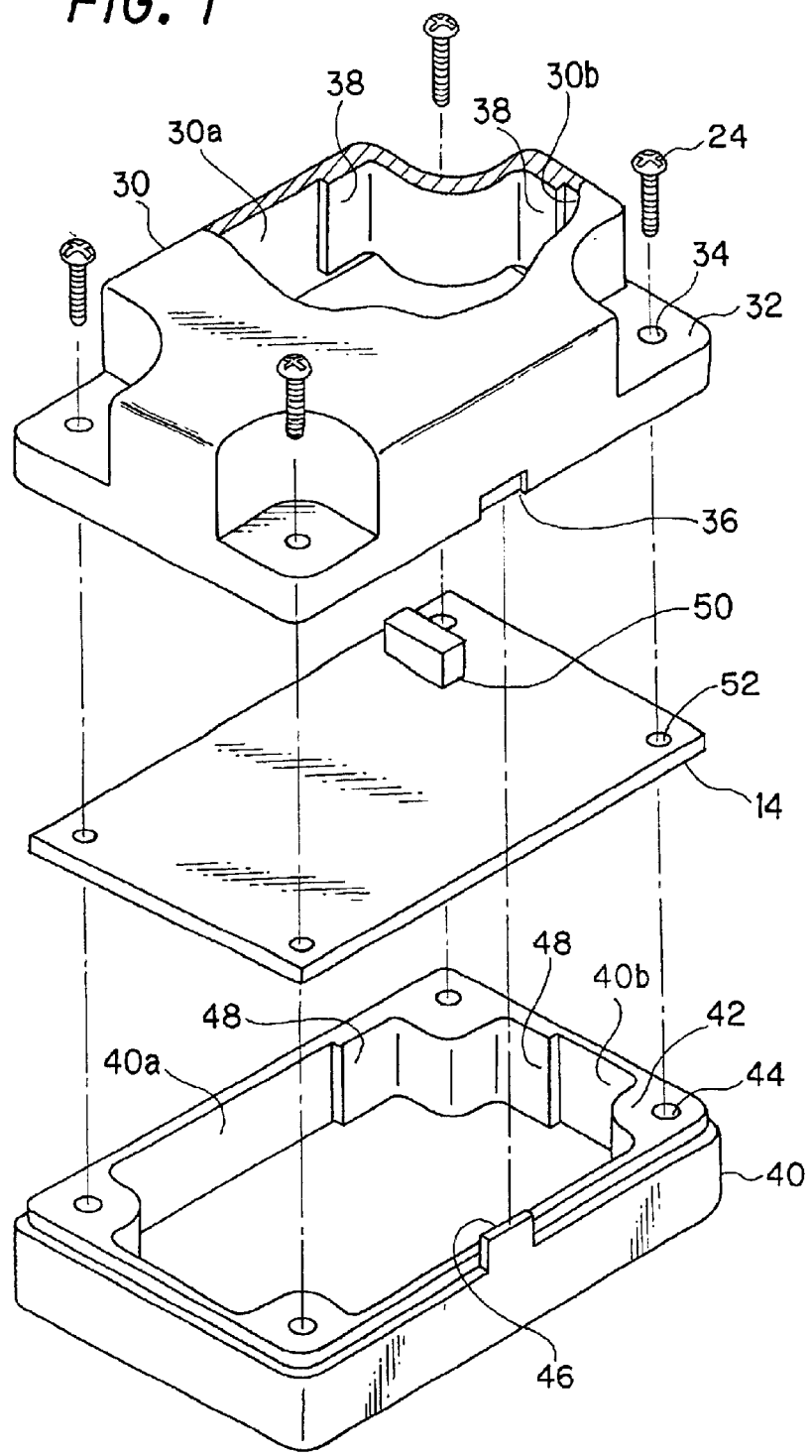
FIG. 1 is an exploded schematic view of an electronic circuit board case according to an embodiment of the present invention.

FIG. 1 is an exploded schematic view of an electronic circuit board case according to an embodiment of the present invention.

The case comprises an upper case member 30 and a lower case member 40 and is used to house an electronic circuit board 14.

The upper case member 30, which has the general shape of a rectangular prism, has a lower peripheral edge portion defining an opening (internal space) on its underside. Each of the four corners of the peripheral edge portion of the upper case member 30 is formed with a flange portion 32 located inside the rectangular prism and outside the internal space of the upper case member 30. The flange portions 32 are formed with fastening holes 34. An outer wall of the peripheral edge portion is formed in the vicinity of the opening with a recess 36. Protrusions 38, explained below, are formed on inner walls 30a and 30b of the peripheral edge portion.

The lower case member 40, which also has the general shape of a rectangular prism, has an upper peripheral edge portion defining an opening (internal space) on its topside. Each of the four corners of the peripheral edge portion of the lower case member 40 is formed with a flange portion 42 located outside the internal space of lower case member 40. Each of the flange portions 42 is formed with a fastening hole 44. An outer wall of the peripheral edge portion is formed in the vicinity of the opening with a projection 46 located opposite the recess 36 of the upper case member 30. Protrusions 48 are formed on inner walls 40a and 40b of the peripheral edge portion at a location each opposite the protrusions 38 of the upper case member 30.

The electronic circuit board 14 has an acceleration sensor (accelerometer), specifically a leadless acceleration sensor 50, mounted near one edge portion thereof and is formed with through-holes 52 at locations each aligned with the respective fastening holes 34, 44 of the upper and lower case members.

The electronic circuit board 14 is integrally fixed in the case by sandwiching it between the flange portions 32 and protrusions 38 of the upper case member 30 and the flange portions 42 and protrusions 48 of the lower case member 40 and then clamping the assembly together by driving screws 24 through the fastening holes 34 of the upper case member and the through-holes 52 of the electronic circuit board into the fastening holes 44 of the lower case member. During this assembly operation, the projection 46 formed on the lower case member engages with the recess 36 formed in the upper case member to ensure that the upper and lower case members 30 and 40 are fastened in proper alignment. In addition, the outer edge portions of the upper case member 30 and the lower case member 40 meet with no gap between them, thus providing a unitary structure.

The structure of the electronic circuit board case of this embodiment will now be explained in further detail with reference to FIGS. 2 to 5.

Figure 2:
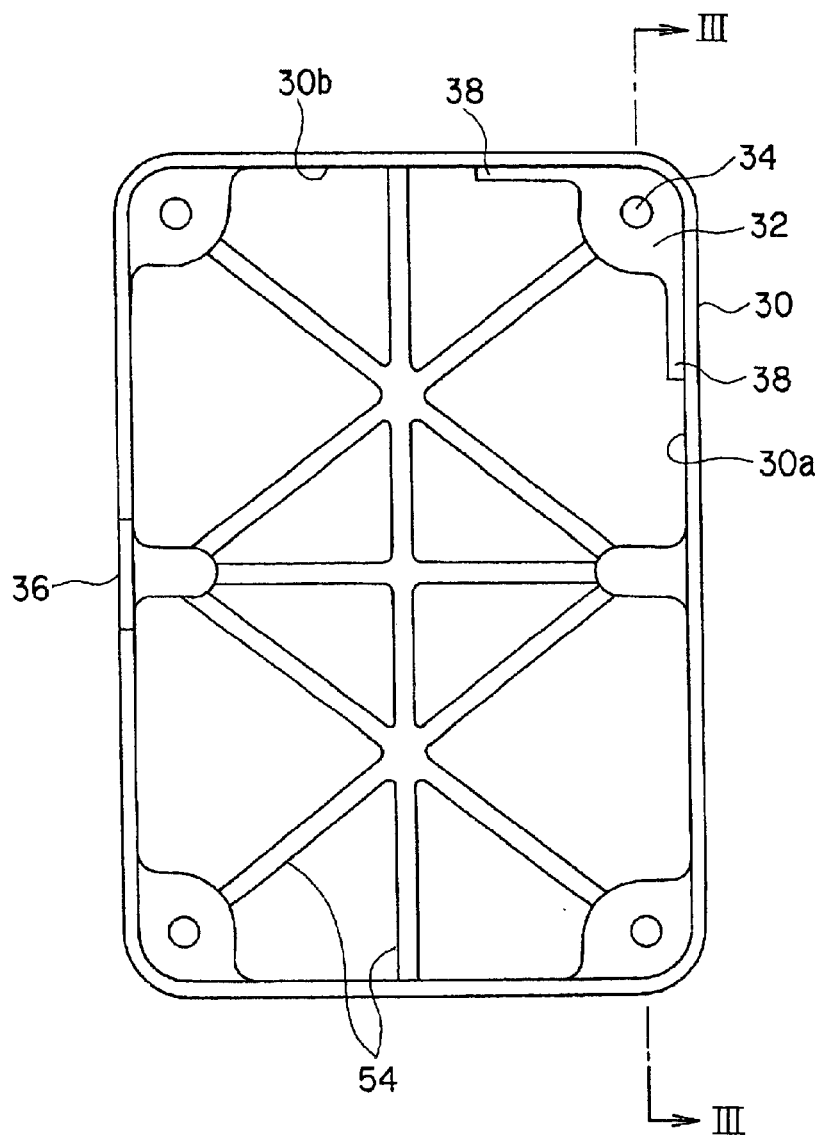
FIG. 2 is a plan view of the upper case member of the electronic circuit board case of FIG. 1.

FIG. 2 is a plan view of the upper case member 30 as seen from the side of its opening. The peripheral edge portion of the upper case member 30 is rectangular and is slightly larger than the periphery of the electronic circuit board 14 to be accommodated. The recess 36 is provided near the middle of one of the longer sides of the peripheral edge portion. Further, as mentioned earlier, the flange portions 32 are provided at the four corners of the upper case member 30 outwardly of internal space thereof. The fastening holes 34 are formed in the flange portions 32.

Figure 3:
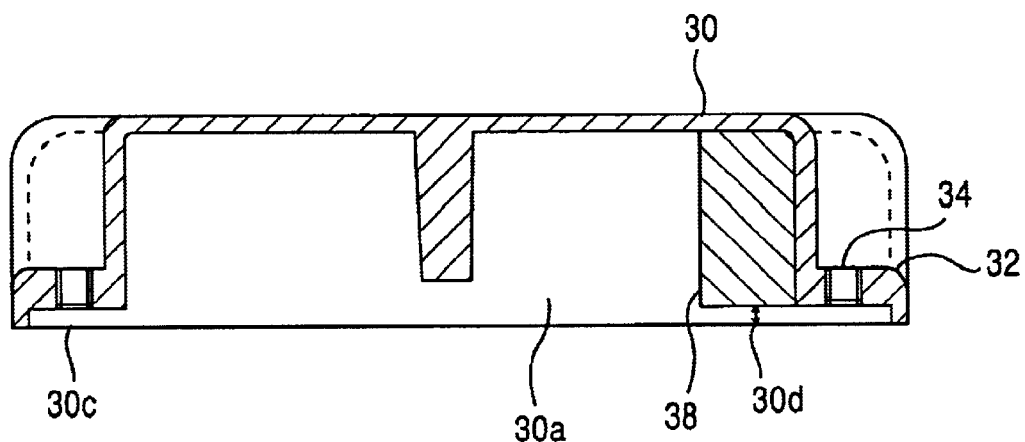
FIG. 3 is a sectional view of the upper case taken along line III—III in FIG. 2.

FIG. 3 is a sectional view of the upper case 30 taken along line III—III in FIG. 2. Owing to the formation of the flange portions 32, the upper case member 30 has a crank-like shape that increases its strength. A recess area 30d is situated between protrusion 38 and bottom edge surface 30c.

As best seen in FIG. 2, the protrusions 38 are formed as integral continuations of one of the flange portions 32 (that at the upper right in the drawing) to run along the inner walls 30a and 30b and project into the internal space of the upper case member 30. As shown in FIG. 3, the protrusion 38 is formed along the inner wall 30a (30b) to extend from the ceiling of the internal space to the bottom of the flange portion 32. When the electronic circuit board 14 is accommodated in the internal space defined by the upper and lower case members 30 and 40, therefore, a local edge region of the electronic circuit board 14 is clamped between the protrusions 38 of the upper case member 30 and the protrusions 48 of the lower case member 40. Warping of the circuit board in this region is therefore prevented. Since only a local edge portion of the electronic circuit board 14 is clamped (immobilized), the mounting area at the circuit board surface is not reduced to a substantial degree. As the protrusions 38 are formed integrally with the flange portion 32 to extend into the internal space of the upper case member 30, moreover, they also work to strengthen the upper case member 30.

The upper case member 30 is additionally reinforced by appropriately providing its ceiling with a plurality of ribs 54.

The structure of the lower case member 40 will now be explained.

Figure 4:
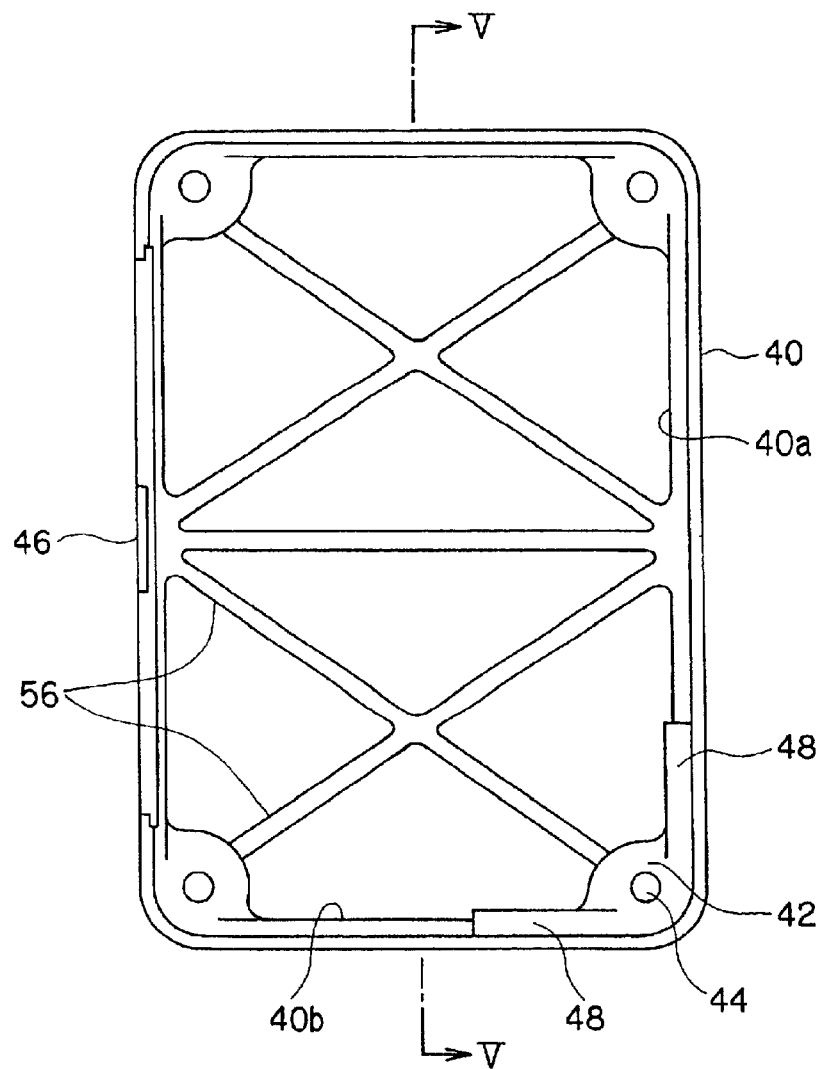
FIG. 4 is a plan view of the lower case member of the electronic circuit board case of FIG. 1.
Figure 5:
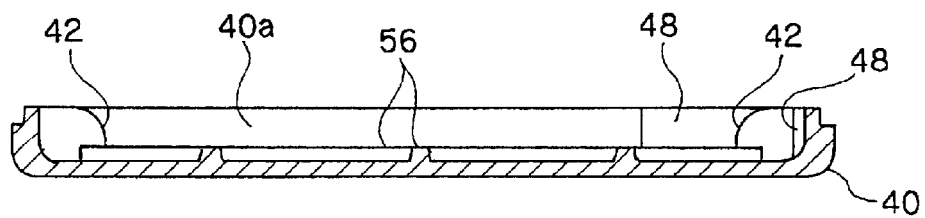
FIG. 5 is a sectional view of the lower case taken along line V—V in FIG. 4.

FIG. 4 is a plan view of the lower case member 40 as seen from the side of its opening. FIG. 5 is a sectional view of the lower case taken along line V—V in FIG. 4. The lower case member 40 has substantially the same structure as the upper case member 30. That is to say, the upper case member 40 also has the general shape of a rectangular prism and the rectangular peripheral edge portion thereof is slightly larger than the periphery of the electronic circuit board 14 to be accommodated. The projection 46 for engagement with the recess 36 of the upper case member 30 is provided near the middle of one of the longer sides of the peripheral edge portion.

The flange portion 42 is provided at each of the four corners of the lower case member 40 outwardly of the internal space thereof. The fastening hole 44 is formed in each of the flange portions 42. The flange portions 42 strengthen the lower case member 40. The flange portions 42 also serve as pedestals for supporting the electronic circuit board 14 and, together with the flange portions 32 to which they are fastened by the screws 24, clamp the electronic circuit board 14.

The lower case member protrusions 48 are provided on the inner walls 40a and 40b of the lower case member at locations opposite the protrusions 38 of the upper case member 30. The protrusions 48 are formed as integral continuations of one of the flange portion 42 to project into the internal space of the lower case member 40. As shown in FIG. 5, the lower case member protrusion 48 is formed along the inner wall 40a (40b) to extend from the floor of the internal space to the top of the flange portion 42. The protrusions 48 operate together with the protrusion 38 of the upper case member to clamp a local edge region of the electronic circuit board 14, thereby preventing warping of the circuit board. As the protrusions 48 are formed integrally with the flange portion 42 to extend into the internal space of the lower case member 40, they also work to strengthen the lower case member 30.

The lower case member 30 is also additionally reinforced by appropriately providing its ceiling with a plurality of ribs 56.

Figure 6:
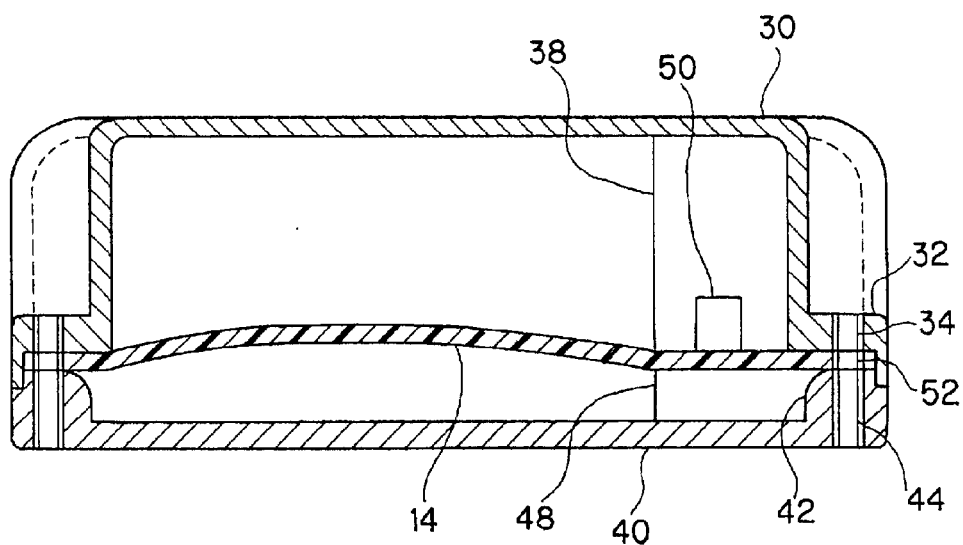
FIG. 6 is a sectional view for explaining electronic circuit board warping in the electronic circuit board case of FIG. 1.

FIG. 6 is a sectional view for explaining warping of the electronic circuit board 14 produced by thermal stress when the electronic circuit board 14 is accommodated in the internal space defined by the upper case member 30 and the lower case member 40. As shown in the drawing, in the case for an electronic circuit board according to the present invention, the point at which warping arises is shifted away from the screw fastening region to the ends of the protrusions 38, 48. As a result, the leadless acceleration sensor 50 can be protected against cracking even when it is mounted in the vicinity of a screw fastening region.

Figure 7A:
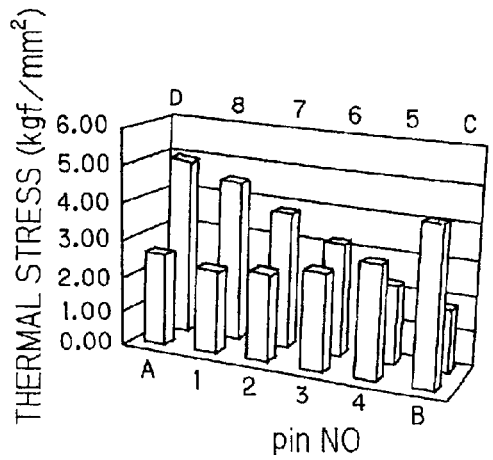
FIGS. 7A and 7B are a set of graphs showing distribution of thermal stress acting on an electronic component.
Figure 7A:
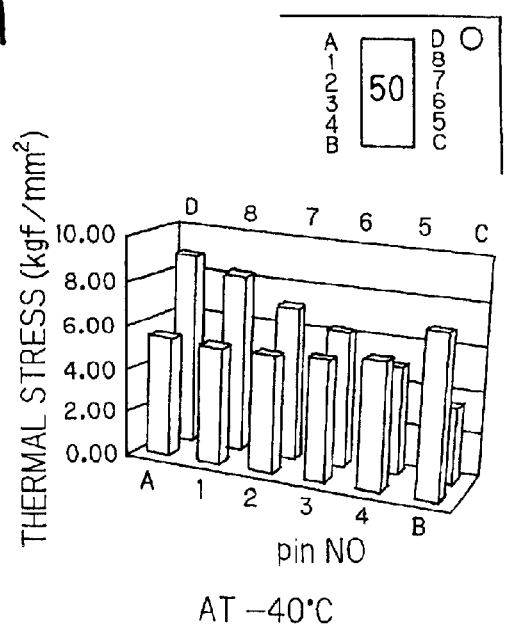
Figure 7B:
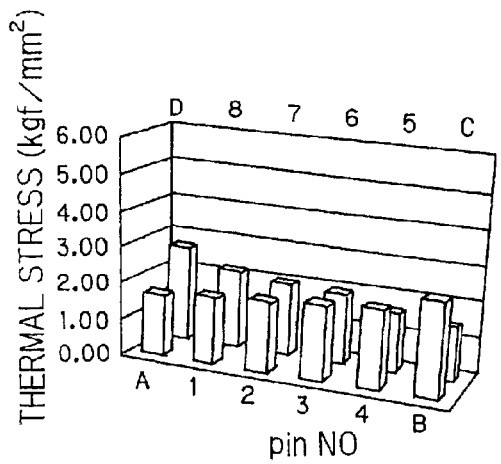
Figure 7B:
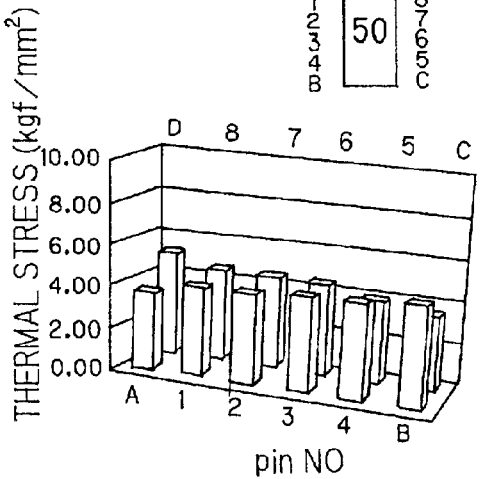
Figure 8:
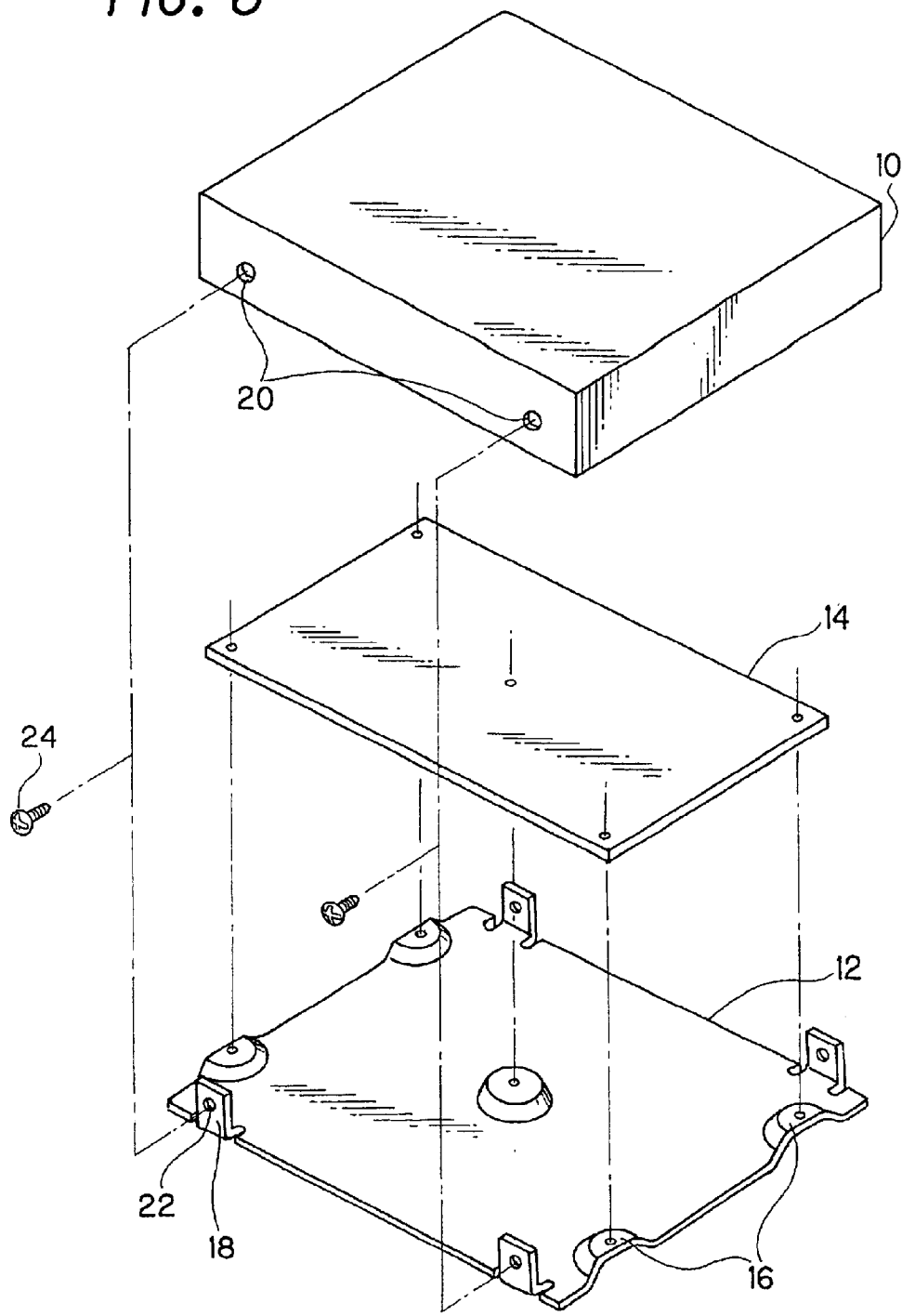
FIG. 8 is an exploded schematic view of a conventional electronic circuit board case.
Figure 9:
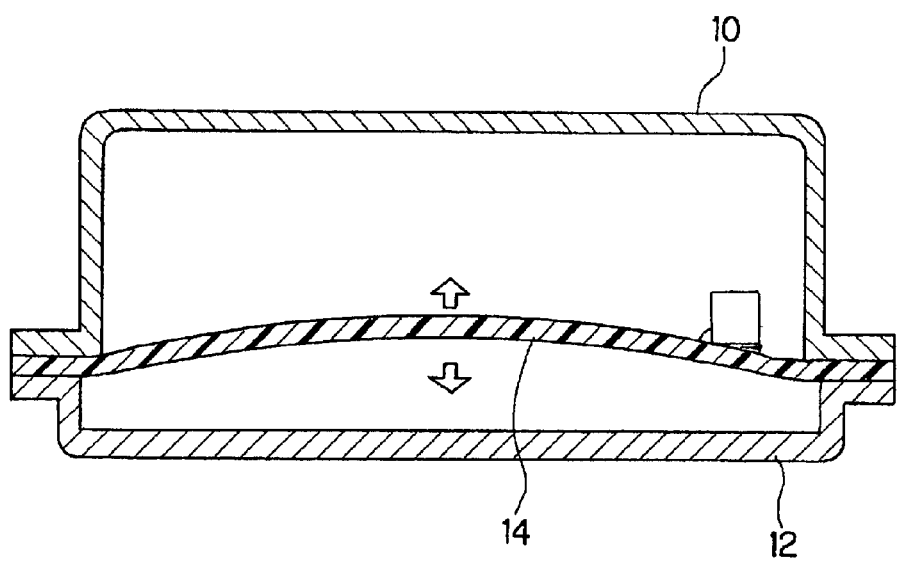
FIG. 9 is a sectional view for explaining electronic circuit board warping in the conventional case having no means for preventing warping.

FIGS. 7A and 7B show the distribution of thermal stress acting of an electronic component mounted in the vicinity of a screw fastening region. The measurement was made with respect to the thermal stress acting on every pin of an electronic component that, as indicated by the alphanumeric characters at the top FIGS. 7A and 7B, had a total of 12 pins (leads) arranged in two rows of 6 pins each.

FIG. 7A shows the thermal stress distribution at temperatures of 100° C. and −40° C. when the electronic circuit board was accommodated in a conventional case without protrusions. It can be seen that when the electronic circuit board was accommodated in a case without protrusions, the pins experienced great local stress at both 100° C. and −40° C. The pin nearest the screw fastening region (D) and pins located at diagonally opposed points of the circuit board (D, 8, 4, B) experienced particularly strong stress. The great difference in the stress values between these and the other pins indicates a high probability of cracking.

FIG. 7B shows the thermal stress distributions at temperatures of 100° C. and −40° C. when the electronic circuit board was accommodated in the case according to the embodiment of the invention described in the foregoing, i.e. a case having protrusions. Stress throughout the electronic component was markedly lower than when the electronic circuit board was accommodated in the case without protrusions. Stress was especially smaller at the pin nearest the screw fastening region (D) and pins located at diagonally opposed points of the circuit board (D, 8, 4, B) and was substantially uniform over the entire electronic component. From this, it can be seen that stress was effectively mitigated by the formation of the protrusions.

Being configured as described in the foregoing, the embodiment of the present invention set out in the foregoing provides a case for an electronic circuit board 14 that, without reducing the mounting area of the circuit board 14 or increasing the number of fabrication steps, prevents warping of the electronic circuit board 14 owing to thermal stress and/or vibration and thus prevents cracking of soldered portions, enables firm and reliable immobilization of the electronic circuit board 14, and achieves increased case strength (of the upper and lower case members 30, 40).

As explained above, the embodiment is configured to have provides a case for an electronic circuit board 14 comprising an upper case member 30 having a peripheral edge portion defining an opening, a lower case member 40 having a peripheral edge portion defining an opening, the peripheral edge portions of the upper and lower case members being of complementary shape, fastening means (fastening holes 34, 44, through-holes 52, screws 24) for fastening the upper case member and the lower case member together with an edge portion of the electronic circuit board 14 between the peripheral edge portions of the upper case member and the lower case member, and protrusions 38, 48 each provided on inner side walls 30*a*, 30*b*, 40*a*, 40*b* of the upper case member and lower case member to face one another such that they clamp a local edge region of the electronic circuit board therebetween.

With this, since an edge portion of the electronic circuit board is clamped between peripheral edge portions of the upper and lower case members and a local edge region of the electronic circuit board is further clamped between the protrusions formed at opposing locations on the inner side walls of the upper and lower case members, the electronic circuit board can be firmly and reliably fastened to the case without reducing the mounting area of the circuit board or increasing the number of fabrication steps, and warping of the electronic circuit board can be prevented so as to preclude occurrence of cracking. In addition, the strength of the case is increased.

The case includes a flange portion 32 formed at each corner of the peripheral edge portion of the upper case member 30 and the lower case member 40 at locations opposite to each other, and wherein the fastening means (fastening holes 34, 44, through-holes 52, screws 24) clamps an edge portion of the electronic circuit board 14 therebetween.

With this, since flange portions are formed to oppose one another at corners of the peripheral edge portions of the upper and lower case members, the fastening means clamps the electronic circuit board between the flange portions, and the protrusions formed at opposing locations on the inner side walls of the upper and lower case members clamp a local edge region of the electronic circuit board, the electronic circuit board can be still more firmly and reliably fastened to the case and the strength of the case can be further increased.

In the case, each of the protrusions 38, 48 is formed integrally with each of the flange portions 32, 42 as continuations thereof.

With this, since the protrusions are formed integrally with flange portions as continuations thereof, warping of the electronic circuit board in the vicinity of the fastening points between the electronic circuit board and case members, i.e., in the vicinity of screw fastening regions, can be effectively prevented. As a result, cracking in the vicinity of the screw fastening regions can also be effectively prevented.

Although the invention was described with regard to an embodiment in which the leadless acceleration sensor 50 was used as an example of an electronic component mounted on the electronic circuit board 14, the electronic component is not limited to a leadless acceleration sensor but can instead by any of various other electronic components and, specifically, can be any of various other leadless components susceptible to cracking.

Although the protrusions 38, 48 were described as being formed at only one corner of each case member, they can be formed at multiple locations as suitable for the mounted electronic components.

Although the number of the elements such as the ribs are plural, the elements may be in a singular number if they can perform the expected functions.

Moreover, the protrusions 38, 48 need not necessarily be formed integrally with the flange portions 32, 42.

While the invention has thus been shown and described with reference to specific embodiments, it should be noted that the invention is in no way limited to the details of the described arrangements; changes and modifications may be made without departing from the scope of the appended claims.

What is claimed is:

1. A case for an electronic circuit board, comprising:

an upper case member having a peripheral edge portion defining an opening;

a recess area being situated between a first protrusion partially protruding away from an inner wall of the upper case member and a bottom edge surface of the upper case member;

a lower case member having a peripheral edge portion defining an opening, the peripheral edge portions of the upper and lower case members being of complementary shape, the lower case member having a second protrusion protruding away from an inner wall of the lower case member, the second protrusion being located opposite to the first protrusion;

a flange portion formed at each corner of the peripheral edge portion of the upper case member and the lower case member at locations opposite to each other and provided with a hole;

an acceleration sensor mounted on a local edge region of the electronic circuit board; and fastening means for fastening the upper case member and the lower case member together with an edge portion of the electronic circuit board through the hole provided at the flange portion formed at the peripheral edge portions of the upper case member and the lower case member and a hole provided at the local edge region of the electronic circuit board such that when the fastening means fastens the upper and lower case members together, the local edge portion of the electronic circuit board is clamped between the upper and lower case members, wherein the recess area accommodates the edge portion of the electronic circuit board when the electronic circuit board is placed in-between the upper case member and the lower case member, and wherein the first and second protrusions are formed to be continuously to each of the flange portions at locations corresponding to the local edge region of the electronic circuit board in such a manner that when the fastening means fastens the upper and lower case members together, the local edge portion of the electronic circuit board is clamped between the first and second protrusions.

2. A case according to claim 1, wherein the upper case member has a rib.

3. A case according to claim 1, wherein the lower case member has a rib.

* * * * *